United States Patent
Hetherton et al.

(12) 
(10) Patent No.: US 6,640,420 B1
(45) Date of Patent: Nov. 4, 2003

(54) PROCESS FOR MANUFACTURING A COMPOSITE POLYMERIC CIRCUIT PROTECTION DEVICE

(75) Inventors: Scott Hetherton, Oconomowoc, WI (US); Wayne Montoya, Redwood City; Thomas Bruguier, Pleasanton, both of CA (US); Randy Daering, Waukesha, WI (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/395,869

(22) Filed: Sep. 14, 1999

(51) Int. Cl.[7] .............................................. H01C 7/02
(52) U.S. Cl. ..................... 29/612; 29/621; 338/22 R; 338/313; 338/314; 338/332
(58) Field of Search ................. 338/22 R, 21, 338/313, 314, 307, 309, 295, 328, 332; 29/613, 612, 611, 610.1, 615, 619, 620, 621.1

(56) References Cited

U.S. PATENT DOCUMENTS

| | | | |
|---|---|---|---|
| 2,482,316 A | 9/1949 | Bocking | 338/328 |
| 3,221,145 A | 11/1965 | Hager, Jr. | 219/549 |
| 3,351,882 A | 11/1967 | Kohler et al. | 338/322 |
| 3,435,399 A | 3/1969 | Gielisse et al. | 338/22 R |
| 3,497,859 A | 2/1970 | Bang | 338/309 |
| 3,648,364 A | 3/1972 | Endo | 29/620 |
| 3,775,725 A | 11/1973 | Endo | 338/262 |
| 3,835,434 A | 9/1974 | Kahn | 338/22 R |
| 4,088,828 A | 5/1978 | Yamamoto et al. | 174/68.5 |
| 4,200,970 A | 5/1980 | Schonberger | 29/593 |
| 4,237,441 A | 12/1980 | van Konynenburg et al. | 338/22 R |
| 4,238,812 A | 12/1980 | Middleman et al. | 361/106 |
| 4,255,698 A | 3/1981 | Simon | 320/35 |
| 4,272,471 A | 6/1981 | Walker | 264/104 |
| 4,304,987 A | 12/1981 | van Konynenburg | 219/553 |
| 4,315,237 A | 2/1982 | Middleman et al. | 338/22 R |

(List continued on next page.)

FOREIGN PATENT DOCUMENTS

| | | |
|---|---|---|
| DE | 2816593 | 10/1979 |
| DE | 3122612 | 12/1982 |
| DE | 8716103 | 3/1988 |

(List continued on next page.)

OTHER PUBLICATIONS

International Search Report for International application No. PCT/US00/25118 dated Jun. 13, 2001.

U.S. Pat. application Ser. No. 08/816,471 (Chandler et al., filed Mar. 13, 1997).

U.S. Pat. application Ser. No. 09/060,278 (Chiang et al., filed Apr. 14, 1998)—MP1676–US.

(List continued on next page.)

Primary Examiner—A. Dexter Tugbang
Assistant Examiner—Paul D Kim

(57) ABSTRACT

A process for manufacturing a composite polymeric circuit protection device in which a polymeric assembly is provided and is then subdivided into individual devices. The assembly is made by providing first and second laminates, each of which includes a laminar polymer element having at least one conductive surface, providing a pattern on at least one of the conductive surfaces on one laminate, securing the laminates in a stack in a desired configuration, at least one conductive surface of at least one of the laminates forming an external conductive surface of the stack, and making a plurality of electrical connections between a conductive surface of the first laminate and a conductive surface of the second laminate. The laminar polymer elements may be PTC conductive polymer compositions, so that the individual devices made by the process exhibit PTC behavior.

43 Claims, 7 Drawing Sheets

U.S. PATENT DOCUMENTS

| | | | |
|---|---|---|---|
| 4,317,027 A | 2/1982 | Middleman et al. | 219/553 |
| 4,327,351 A | 4/1982 | Walker | 338/22 R |
| 4,330,703 A | 5/1982 | Horsma et al. | 219/553 |
| 4,352,083 A | 9/1982 | Middleman et al. | 338/23 |
| 4,371,860 A | 2/1983 | May et al. | 338/21 |
| 4,388,607 A | 6/1983 | Toy et al. | 338/22 SD |
| 4,426,633 A | 1/1984 | Taylor | 338/25 |
| 4,434,416 A | 2/1984 | Schonberger | 338/22 R |
| 4,445,026 A | 4/1984 | Walker | 219/553 |
| 4,463,407 A | 7/1984 | Berger et al. | 361/306 |
| 4,475,138 A | 10/1984 | Middleman et al. | 361/58 |
| 4,486,737 A | 12/1984 | Ott | 338/22 R |
| 4,486,738 A | 12/1984 | Sadlo et al. | 338/320 |
| 4,514,620 A | 4/1985 | Cheng et al. | 219/553 |
| 4,529,960 A | 7/1985 | Uchida et al. | 338/309 |
| 4,534,889 A | 8/1985 | van Konynenburg et al. | 252/511 |
| 4,545,926 A | 10/1985 | Fouts et al. | 252/511 |
| 4,560,498 A | 12/1985 | Horsma et al. | 252/511 |
| 4,591,700 A | 5/1986 | Sopory | 219/505 |
| 4,593,181 A | 6/1986 | Jensen et al. | 219/541 |
| 4,605,471 A | 8/1986 | Mitchell | 156/645 |
| 4,660,017 A | 4/1987 | Momoki et al. | 338/21 |
| 4,689,475 A | 8/1987 | Matthiesen | 219/553 |
| 4,706,060 A | 11/1987 | May | 338/20 |
| 4,714,910 A | 12/1987 | Schwingenschuh et al. | 338/21 |
| 4,724,417 A | 2/1988 | Au et al. | 338/22 R |
| 4,757,298 A | 7/1988 | Nishikawa et al. | 338/336 |
| 4,757,581 A | 7/1988 | Yamada et al. | 29/25.35 |
| 4,774,024 A | 9/1988 | Deep et al. | 252/511 |
| 4,777,718 A | 10/1988 | Henderson et al. | 29/620 |
| 4,780,598 A | 10/1988 | Fahey et al. | 219/511 |
| 4,786,888 A | 11/1988 | Yoneda et al. | 338/22 R |
| 4,788,523 A | 11/1988 | Robbins | 338/309 |
| 4,800,253 A | 1/1989 | Kleiner et al. | 219/553 |
| 4,801,784 A | 1/1989 | Jensen et al. | 219/548 |
| 4,811,164 A | 3/1989 | Ling et al. | 361/321 |
| 4,845,838 A | 7/1989 | Jacobs et al. | 29/671 |
| 4,861,966 A | 8/1989 | Matthiesen et al. | 219/205 |
| 4,873,508 A | 10/1989 | Ankenman et al. | 338/25 |
| 4,876,439 A | 10/1989 | Nagahori | 338/22 R |
| 4,882,466 A | 11/1989 | Friel | 219/219 |
| 4,904,850 A | 2/1990 | Claypool et al. | 219/548 |
| 4,907,340 A | 3/1990 | Fang et al. | 29/610.1 |
| 4,924,074 A | 5/1990 | Fang et al. | 219/548 |
| 4,924,204 A | 5/1990 | Uchida | 338/22 R |
| 4,924,205 A | 5/1990 | Caporali et al. | 338/227 |
| 4,935,156 A | 6/1990 | van Konynenburg et al. | 219/553 |
| 4,937,551 A | 6/1990 | Plasko | 338/22 R |
| 4,959,505 A | 9/1990 | Ott | 174/52.2 |
| 4,977,309 A | 12/1990 | Uchida | 219/541 |
| 4,992,771 A | 2/1991 | Caporali et al. | 338/22 R |
| 4,993,142 A | 2/1991 | Burke et al. | 29/621 |
| 5,015,824 A | 5/1991 | Monter et al. | 219/219 |
| 5,017,243 A | 5/1991 | Otsubo | 136/244 |
| 5,049,850 A | 9/1991 | Evans et al. | 338/22 R |
| 5,057,811 A | 10/1991 | Strott et al. | 338/22 R |
| 5,085,364 A | 2/1992 | Ishikawa et al. | 228/139 |
| 5,089,801 A | 2/1992 | Chan et al. | 338/22 R |
| 5,142,263 A | 8/1992 | Childers et al. | 338/21 |
| 5,166,658 A | 11/1992 | Fang et al. | 338/23 |
| 5,194,316 A | 3/1993 | Horner et al. | 428/195 |
| 5,196,136 A | 3/1993 | Dishart et al. | 252/170 |
| 5,210,516 A | 5/1993 | Shikama et al. | 338/22 R |
| 5,212,466 A | 5/1993 | Yamada et al. | 338/22 R |
| 5,216,404 A | 6/1993 | Nagai et al. | 338/22 SD |
| 5,228,188 A | 7/1993 | Badihi et al. | 29/623 |
| 5,241,741 A | 9/1993 | Sugaya | 29/612 |
| 5,247,277 A | 9/1993 | Fang et al. | 338/22 R |
| 5,258,738 A | 11/1993 | Schat | 338/332 |
| 5,271,548 A | 12/1993 | Maiwald | 228/175 |
| 5,280,263 A | 1/1994 | Sugaya | 338/22 R |
| 5,291,535 A | 3/1994 | Baker et al. | 378/22 |
| 5,303,115 A | 4/1994 | Nayar et al. | 361/106 |
| 5,347,258 A | 9/1994 | Howard et al. | 338/333 |
| 5,351,390 A | 10/1994 | Yamada et al. | 29/612 |
| 5,378,407 A | 1/1995 | Chandler et al. | 252/513 |
| 5,382,938 A | 1/1995 | Hansson et al. | 338/22 R |
| 5,451,919 A | 9/1995 | Chu et al. | 338/22 R |
| 5,451,921 A | 9/1995 | Crawford et al. | 338/220 |
| 5,488,348 A | 1/1996 | Asida et al. | 338/22 R |
| 5,582,770 A | 12/1996 | Chu et al. | 252/511 |
| 5,747,147 A | 5/1998 | Wartenberg et al. | 428/209 |
| 5,777,541 A | 7/1998 | Vekeman | 338/22 R |
| 5,801,612 A | 9/1998 | Chandler et al. | 338/22 R |
| 5,818,676 A | 10/1998 | Gronowicz, Jr. | 338/22 R |
| 5,831,510 A * | 11/1998 | Zhang | 338/22 R |
| 5,852,397 A * | 12/1998 | Chan | 338/22 R |
| 5,864,281 A | 1/1999 | Zhang et al. | 338/22 R |
| 5,907,271 A * | 5/1999 | Hirano | 338/22 R |
| 5,907,272 A * | 5/1999 | Mcguire | 338/22 R |
| 5,907,273 A | 5/1999 | Ross, Jr. et al. | 338/313 |
| 6,020,808 A * | 2/2000 | Hogge | 338/22 R |
| 6,104,587 A | 8/2000 | Chu | 361/106 |
| 6,130,597 A | 10/2000 | Toth et al. | 338/22 R |
| 6,172,591 B1 * | 1/2001 | Barrett | 338/22 R |

FOREIGN PATENT DOCUMENTS

| | | |
|---|---|---|
| DE | 3839868 | 6/1989 |
| DE | 3910861 | 11/1989 |
| DE | 4000089 | 7/1990 |
| EP | 0223404 | 5/1987 |
| EP | 0790625 A2 | 8/1987 |
| EP | 0308306 | 3/1989 |
| EP | 0398811 | 11/1990 |
| EP | 0509582 | 10/1992 |
| EP | 0649562 | 3/1998 |
| EP | 0 955 643 A | 11/1999 |
| GB | 1415454 | 11/1975 |
| JP | 49-28594 | 8/1974 |
| JP | 54-73260 | 6/1979 |
| JP | 56-150802 | 11/1981 |
| JP | 61-124104 | 6/1986 |
| JP | 63-216301 | 9/1988 |
| JP | 63-244702 | 10/1988 |
| JP | 5-29111 | 2/1993 |
| JP | 6-283301 | 10/1994 |
| WO | WO 84/01259 | 3/1984 |
| WO | WO94/01876 | 1/1994 |
| WO | WO95/08176 | 3/1995 |
| WO | WO 95/31816 | 11/1995 |
| WO | WO 95/34084 | 12/1995 |
| WO | WO 98/12715 | 3/1998 |
| WO | WO 98/29879 | 7/1998 |
| WO | WO99/45551 | 9/1999 |

OTHER PUBLICATIONS

U.S. Pat. application Ser. No. 09/181.028 (Graves et al, filed Oct. 27, 1998)—MP1454–US9.

U.S. Pat. application Ser. No. 09/364,504 (Isozaki et al., filed Jul. 30, 1999)—YH011–US1.

Coombs, *Printed Circuit Handbook*, 1996, pp. 24.1 –24.17, 40.1 –40.4.

Harper, *Electronic Packaging and Interconection Handbook* (1991), pp. 1.37 –1.43, 8.3 –8.5, 8.53 –8.56, 9.1 9.16, 9.41 –9.49.

Patent Abstracts of Japan, vol. 013, No. 198 (E–756), May 11, 1989 & JP 01–020601A (JCG Corp.), Jan. 24, 1989, abstract.

"PolySwitch PTC Devices", Standard Product List, Raychem Corporation, May 1992.

"PolySwitch SMD Installation Guidelines" trade brochure, Raychem Corporation, Nov. 1992.

"PolySwitch SMD Surface Mount Devices PTC Overcurrent Protection" trade brochure, Raychem Corporation, Nov. 1992.

"Protection of Batteries with PolySwitch Devices", Raychem Corporation, Jan. 1987.

Search Report for International Application No. PCT/US93/06480, Oct. 7, 1993.

Search Report for International Application No. PCT/US94/10137, Nov. 23, 1994.

Search Report for International Application No. PCT/US95/05567, Jun. 26, 1995.

Search Report for International Application No. PCT/US95/07420, Sep. 4, 1995.

Standler, *Protection of Electronic Circuits from Overvoltages*, 1989, p. 133.

Sunahara, JP 40415001A (May 1992), abstract.

U.S. patent application Ser. No. 07/893626 (Chandler et al.), filed Jun. 5, 1992.

* cited by examiner

PROCESS FOR MANUFACTURING A COMPOSITE POLYMERIC CIRCUIT PROTECTION DEVICE

BACKGROUND OF THE INVENTION

1. Field of the Invention

This invention relates to electrical devices and assemblies and methods of making such devices and assemblies.

2. Introduction to the Invention

Circuit protection devices comprising a conductive polymer composition having a positive temperature coefficient (PTC) are well-known. Such devices which are intended for surface mounting onto a substrate, e.g. a printed circuit board, are disclosed in U.S. Pat. Nos. 5,831,510 (Zhang et al), 5,852,397 (Chan et al), and 5,864,281 (Zhang et al), International Publications Nos. 94/01876 (Raychem Corporation) and 95/08176 (Raychem Corporation), and copending, commonly assigned application No. 09/181,028 (Graves et al, filed Oct. 27, 1998), the disclosures of which are incorporated herein by reference. Such circuit protection devices generally comprise first and second laminar electrodes; a laminar PTC resistive element sandwiched between the electrodes; a third (residual) laminar conductive member which is secured to the same face of the PTC element as the second electrode but is separated therefrom; and a cross-conductor which passes through an aperture in the PTC element and connects the third conductive member and the first electrode. This permits connection to both electrodes from the same side of the device, so that the device can be connected flat on a printed circuit board, with the first electrode on top, without any need for leads. The resistive element preferably comprises a laminar element composed of a PTC conductive polymer. Preferably the device comprises an additional conductive member and an additional cross-conductor, so that the device is symmetrical and can be placed either way up on a circuit board.

When two of these devices are physically secured together in a stacked configuration, a composite device can be formed. Such composite devices have the same small "foot-print" on the board, i.e. occupy a small area, as a single device, but they have a lower resistance than can be conveniently produced by using a single device. In addition, the power dissipation of such a composite device is not substantially different from the power dissipation of one of the devices alone. As a result, the composite device has a lower resistance for a given hold current where "hold current" is the largest current which can be passed through a device without causing it to trip.

SUMMARY OF THE INVENTION

As described in copending, commonly assigned U.S. patent application No. 09/060,278 (Chiang et al, filed Apr. 14, 1998), the disclosure of which is incorporated herein by reference, composite devices can be prepared by sorting individual devices and then assembling the sorted devices into composite devices. Such a process can be tedious, as it may require that the resistance of each individual device be read. We have now found, in accordance with the present invention, that it is possible to prepare a multilayer assembly from which individual composite devices can be divided. Such an assembly allows preparation of a large number of composite devices simultaneously. Furthermore, because the process described herein allows the patterning of individual layers of the assembly before or after fabrication into the assembly, a variety of different devices can be prepared from the same starting layers. In addition, the composition of the layers can be easily varied, allowing the simple build-up of devices with combined functionality. Various interconnection schemes between layers can be simply implemented, and devices with multiple external electrical contacts can be made without changing the basic manufacturing process. All of these further add to the broad range of different devices which can be inexpensively mass-produced by the process disclosed herein.

This invention provides methods and pro for which various operative steps can be carried out on an assembly which will yield a plurality of devices when subdivided into composite devices by subdividing along both x- and y-directions (where x and y correspond to directions in the plane of the laminar PTC elements). The ability to prepare devices in this way is a significant improvement over other methods, for example described in U.S. application No. 09/060,278, because for this invention, individual devices do not need to be individually assembled, increasing the efficiency and before reducing the cost of the manufacturing process. Finally, the method of combining layers of materials to form composite devices disclosed herein allows an extremely simple yet adaptable method for forming a variety of devices without the necessity of changing the basic manufacturing process.

In a first aspect this invention provides a process for manufacturing a composite polymeric circuit protection device, said process comprising (1) providing a polymeric assembly comprising
   (a) providing first and second laminates, each of which comprises a laminar polymer element having at least one conductive surface,
   (b) providing a pattern of conductive material on at least one of the conductive surfaces on one laminate;
   (c) securing the laminates in a stack in a desired configuration, at least one conductive surface of at least one of the laminates comprising an external conductive surface of the stack, and
   (d) making a plurality of electrical connections between a conductive surface of the first laminate and a conductive surface of the second laminate; and
(2) subdividing the stack into individual devices each of which comprises at least one electrical connection.

In a second aspect this invention provides a polymeric assembly comprising:

(a) a first laminate comprising a laminar polymer element having at least one conductive surface having a pattern;
(b) a second laminate comprising a laminar polymer element having at least one conductive surface having a pattern said second laminate being secured to the first laminate in a stack so that the stack has first and second external conductive surfaces; and
(c) a plurality of transverse conductive members which run through the first and second laminates between the first and second external conductive surfaces.

Using either the process or the assembly of the invention, devices can be made by creating electrode precursors in the form of conductive surfaces of appropriate shapes upon resistive elements which are larger than the desired final shape, forming a stack of a plurality of resistive elements which is also larger than the desired final shape, and then subdividing the stack into individual devices. Electrodes of appropriate shapes can be made by removing unwanted portions of any one, or any combination, of the conductive surfaces. The removal can be accomplished by milling, stamping, or etching, for example. Alternatively, the electrode precursors can be formed by patterning conductive material onto any one or any combination of the PTC resistive element surfaces by chemical vapor deposition, electrodeposition, sputtering, etc. Conductive material may also be applied to the faces of the PTC resistive elements by use of an adhesive or tie layer. Electrical interconnection between a desired combination of the conductive surfaces of the plurality of resistive elements can be accomplished before the stack has been subdivided into individual devices. Alternatively, some or all of the electrical connections between desired electrodes or contact points can be made after the stack has been subdivided into composite devices. The electrical interconnection can be designed so that connection is made between some of the conductive surfaces of the stack or the electrodes of the device, but not all.

Thus in a third aspect, this invention provides a composite device, which can be made, for example, using the process of the first aspect of the invention or the assembly of the second aspect, comprising (1) first and second external laminar electrodes, (2) third and fourth internal laminar electrodes, (3) first and second laminar PTC resistive elements, each of which (i) exhibits PTC behavior, and (ii) comprises a laminar element composed of a PTC conductive polymer, said first resistive element having a first face to which the first external electrode is secured and an opposite second face to which the third internal electrode is secured, and said second resistive element having a first face to which the second external electrode is secured and an opposite second face to which the fourth internal electrode is secured, (4) a fifth external laminar conductive member which (i) secured to the first face of the first PTC resistive element, and (ii) is spaced apart from the first external electrode, (5) a sixth external laminar conductive member which (i) is secured to the first face of the second PTC resistive element, and (ii) is spaced apart from the second external electrode, (6) a seventh internal laminar conductive member which (i) is secured to the second face of the first PTC resistive element, and (ii) is spaced apart from the third internal electrode, (7) an eighth internal laminar conductive member which (i) is secured to the first face of the second PTC resistive element, and (ii) is spaced apart from the fourth internal electrode, (8) a first aperture which runs between the first external electrode of the first laminar PTC element and the second external electrode of the second laminar PTC element, (9) a second aperture which runs between the fifth external laminar conductive member of the first laminar PTC element and the sixth external laminar conductive member of the second laminar PTC element,

(10) a first transverse conductive member which
(a) lies within the first aperture,
(b) runs between the first external electrode of the first laminar PTC element and the second external electrode of the second laminar PTC element,
(c) is secured to the first PTC element, the second PTC element and the third laminar element, and
(d) is physically and electrically connected to the first external laminar electrode, the seventh internal laminar conductive member, the eighth internal laminar conductive member, and the second external laminar electrode, but is not connected to the third or the fourth internal electrode, and

(11) a second transverse conductive member which
(a) lies within the second aperture,
(b) runs between the fifth external laminar conductive member and the sixth external laminar conductive member,
(c) is secured to the first PTC element, the second PTC element and the third laminar polymer layer, and
(d) is physically and electrically connected to the fifth external laminar conductive member, the third internal electrode, the fourth internal electrode, and the sixth external laminar conductive member, but is not connected to the first or second external electrode.

BRIEF DESCRIPTION OF THE DRAWINGS

The invention is illustrated in the accompanying drawings, in which.

DETAILED DESCRIPTION OF THE INVENTION

Figure 1:
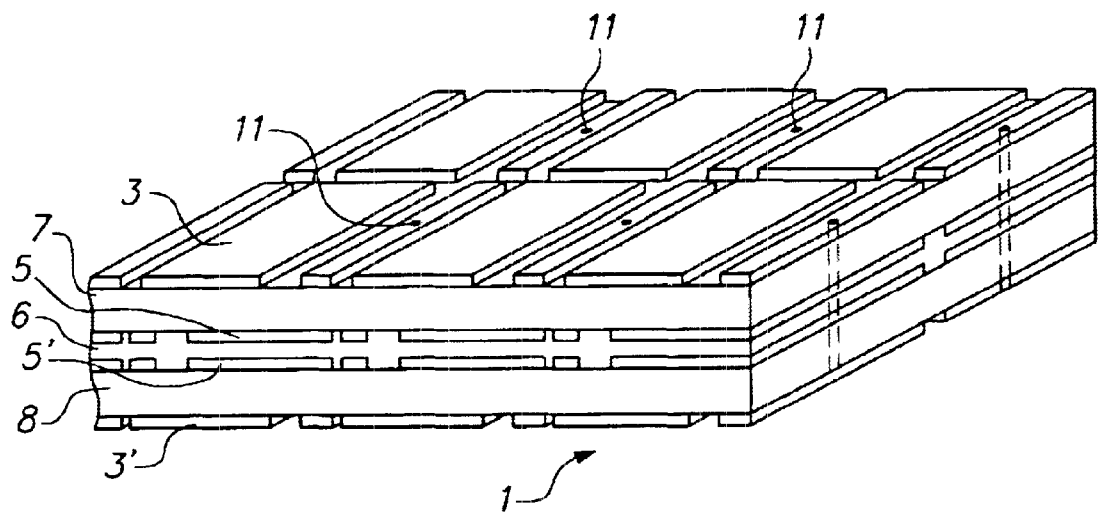
FIG. 1 is a perspective view of a section of a stack formed in the first aspect of the invention, which can be subdivided into a plurality of individual composite devices.

As described and claimed below, and as illustrated in the Figures, this invention incorporates a number of features. Where such a feature is disclosed in a certain context or as part of a particular combination, it can also be used in other contexts and in other combinations, including combinations of any number of such features.

PTC and Resistive Elements

Assemblies and devices of the invention generally comprise at least one laminar polymer element or resistive element which comprises a PTC composition which exhibits positive temperature coefficient (PTC) behavior, i.e. it shows a sharp increase in resistivity with temperature over a relatively small temperature range. The term "PTC" is used to mean a composition or device that has an $R_{14}$ value of at least 2.5 and/or an $R_{100}$ value of at least 10, and it is preferred that the composition or device should have an $R_{30}$ value of at least 6, where $R_{14}$ is the ratio of the resistivities at the end and the beginning of a 14° C. range, $R_{100}$ is the ratio of the resistivities at the end and the beginning of a 100° C. range, and $R_{30}$ is the ratio of the resistivities at the end and the beginning of a 30° C. range.

The PTC compositions used in the present invention are preferably conductive polymers which comprise a crystalline polymer component and, dispersed in the polymer component, a particulate filler component which comprises a conductive filler, e.g. carbon black or a metal. The filler component may also contain a non-conductive filler, which changes not only the electrical properties of the conductive polymer but also its physical properties. The composition can also contain one or more other components, e.g. an antioxidant, crosslinking agent, coupling agent, flame retardant, or elastomer. The PTC composition preferably has a resistivity at 23° C. of less than 50 ohm-cm, particularly less than 10 ohm-cm; especially less than 5 ohm-cm. Suitable conductive polymers for use in this invention are disclosed for example in U.S. Pat. Nos. 4,237,441 (van Konynenburg et al), 4,304,987 (van Konynenburg), 4,514,620 (Cheng et al), 4,534,889 (van Konynenburg et al), 4,545,926 (Fouts et al), 4,724,417 (Au et al), 4,774,024 (Deep et al), 4,935,156 (van Konynenburg et al), 5,049,850 (Evans et al), 5,378,407 (Chandler et al), 5,451,919 (Chu et al), 5,582,770 (Chu et al), 5,747,147 (Wartenberg et al), and 5,801,612 (Chandler et al), and U.S. patent application No. 09/364,504 (Isozaki et al, filed Jul. 30, 1999). The disclosure of each of these patents and applications is incorporated herein by reference.

Alternatively, the PTC composition can be a ceramic material.

Laminar Elements

Devices of the invention preferably comprise PTC resistive elements which are laminar elements, and can be composed of one or more conductive polymer members, at least one of which is composed of a PTC material. When there is more than one conductive polymer member, the current preferably flows sequentially through the different compositions, as for example when each composition is in the form of a layer which extends across the whole device. When there is a single PTC composition, and the desired thickness of the PTC element is greater than that which can conveniently be prepared in a single step, a PTC element of the desired thickness can conveniently be prepared by joining together, e.g. laminating by means of heat and pressure, two or more layers, e.g. melt-extruded layers, of the PTC composition. When there is more than one PTC composition, the PTC element will usually be prepared by joining together, e.g. laminating by means of heat and pressure, elements of the different compositions.

Assemblies of the invention comprise first and second laminates, and may comprise additional laminates. The first and second laminates each comprise a laminar polymer element having at least one conductive surface, e.g. in the form of a metal foil electrode as described below. In is specification, each laminate is referred to as a layer. The laminar elements of the first and second laminates may comprise PTC compositions which are the same, or the layers may comprise different PTC compositions. For example, PTC compositions of different resistivities may be used, and an interconnection scheme devised so that one layer can act as a heater, and a second layer can act as an overcurrent protection device. The layers may also comprise PTC compositions of different switching temperatures (i.e. the temperature at which the device switches from a low resistance to a high resistance state). For example, such a device may be useful for creating a two-tier PTC temperature sensor, with one layer being the most sensitive for a lower temperate range, and the second layer being the most sensitive for a higher temperate range. Furthermore, one or more of the laminates may comprise a zero temperature coefficient of resistance (ZTC) composition or a negative temperature coefficient of resistance (NTC) composition.

It is not necessary that each of the laminates comprise a conductive layer. For example, other compositions which can be used for a laminar element in the composite devices comprise a dielectric material such as polyester or a filled dielectric material such as FR4 epoxy. This can function as an insulating layer which provides extra rigidity to the device, or the material can be chosen to assist in the mounting and packaging of the device. In addition, a laminar element can comprise a composition which has a relatively high thermal conductivity to aid in the thermal transfer between layers of the composite, or between a substrate and a layer of the composite for a surface mounted device. Conversely, a laminar element can comprise a composition which has a relatively low thermal conductivity to act as a thermal insulator between layers or between a layer and the substrate. When it is desired that the device have the capability to respond to an overvoltage, a layer of the composite can comprise a material which is normally insulating but becomes conducting when a certain voltage threshold level is reached. Such compositions include varistor particles dispersed in a polymeric matrix. Other compositions which may be useful for various embodiments of this invention include flame retardant materials, intumescants, and microwave absorbing materials to allow the heating of the device using radiation of a specific frequency range.

The thicknesses of the laminar elements comprising the assembly used to prepare a composite device may be different. For example, a very tin laminar element may be used as one layer to provide an extremely low resistance, and a thicker laminar element may be used as a second layer to provide mechanical strength.

Electrodes and Conductive Surfaces

Particularly useful devices made by the process of the invention comprise at least two metal foil electrodes, with polymer elements sandwiched between them. An especially useful device will comprise a stack comprising n polymeric PTC elements, each having two metal foil electrodes, and (n−1) adhesive layers sandwiched between the PTC elements in an alternating pattern to form a composite device, with the PTC elements comprising the top and bottom components of the stack. This device will have the electrodes electrically connected such that the PTC elements will be connected in parallel, resulting in a composite device which has a low resistance at 20° C., generally less than 10 ohms, preferably less than 5 ohms, more preferably less than 1 ohm, particularly less than 0.5 ohm, with yet lower resistance being possible, e.g. less than 0.05 ohm. Particularly suitable foil electrodes are microrough metal foil electrodes, in particular as disclosed in U.S. Pat. Nos. 4,689,475 (Matthiesen) and 4,800,253 (Kleiner et al), and in copending, commonly assigned U.S. application No. 08/816,471 (Chandler et al, filed Mar. 13, 1997), the disclosure of each of which is incorporated herein by reference. The electrodes can be modified so as to produce desired thermal effects and so as to provide electrical contact points for various interconnection points between the layers of the composite device to give the desired functionality, and to provide electrical contact points for mounting the device onto printed circuit boards, sockets, clips, or other suitable applications. Examples of composite devices which incorporate multiple internal and external contact points are illustrated in FIGS. 16 to 20, 22, and 23.

Similar types of metal foil can be used to form the conductive surfaces of the laminates in the polymeric assembly. Alternatively, the conductive surface may be formed from a conductive ink, a sputtered or otherwise applied metal layer, a metal mesh, or another suitable layer. Particularly preferred conductive surfaces are those which can be etched, e.g. for patterning, and/or soldered easily. The conducive surface of the laminates has a resistivity at 25° C. which is at least 100 times lower than the resistivity at 25° C. of the polymer element to which it is attached.

The patterns may be the same on both sides of a given laminate, or they may be different. Additional patterns may be created at any point in the process, e.g. on an external conductive surface of the laminate once a stacked assembly is formed, or as attachments are made to internal conductive surfaces before the stacked assembly is completed.

Apertures and Cross-Conductors

The term "aperture" is used herein to denote an opening which, when viewed at right angles to the plane of the device, (a) has a closed cross-section, e.g. a circle, an oval, or a generally polygonal shape, or (b) has a reentrant cross-section, the term "reentrant cross-section" being used to denote an open cross-section which (i) has a depth at least 0.15 times, preferably at least 0.5 times, particularly at least 1.2 times, the maximum width of the cross-section, e.g. a quarter circle or a half circle or an open-ended slot, and/or (ii) has at least one part where the opposite edges of the cross-section are parallel to each other.

Since the invention involves assemblies which can be divided into a plurality of electrical devices, the apertures will normally be of closed cross-section, but if one or more of the lines of division passes through an aperture of closed cross-section, then the apertures in the resulting devices will have open cross-sections. Although for some embodiments, it is desirable that an open cross-section is a reentrant cross-section as defined above, in order to ensure that the cross-conductor, which passes through the aperture, is not damaged or dislodged during installation or use of the device, for other embodiments, it is preferred that the cross-conductor is a plating on one transverse flat face of the device. In order to produce such a device, it is preferred that the assembly, which is to be divided into a plurality of devices, has a plurality of elongate rectangular apertures, e.g. slots, each with metal plating thereon. The assembly is then divided so that each plated aperture provides a flat transverse conductive member on a number of devices.

The apertures in the assembly may be of different sizes and/or shapes to accommodate device configurations and current-carrying capabilities.

The aperture can be a circular hole, and this is satisfactory in many cases. However, if the assembly includes apertures which are traversed by at least one line of division, elongate apertures may be preferred because they require less accuracy in the lines of division.

When the aperture is not traversed by a line of division, it can be as small as is convenient for a cross-conductor having the necessary current-carrying capacity. Generally a single cross-conductor is all that is needed to make an electrical connection to the first electrode to the opposite side of the device. However, two or more cross-conductors can be used to make the same connection. The number and size of the cross-conductors, and, therefore, their thermal capacity, can have an effect on the rate at which a circuit protection device will trip. Generally the apertures and cross-conductors can extend throughout all layers of the assembly. Alternatively, apertures and cross-conductors can extend through only some layers of the assembly to form devices of different functionality.

The aperture can be formed before the cross-conductor is put into place, or the formation of the aperture and the placing of the cross-conductor can be carried out simultaneously. A preferred procedure is to form an aperture, e.g. by drilling, slicing, routing or any other appropriate technique, and then to plate or otherwise coat or fill the interior surface of the aperture. The plating can be effected by electroless plating, or electrolytic plating, or by a combination of both. The plating can be a single layer or multiple layers, and can be composed of a single metal or a mixture of metals, in particular a solder. The plating will often be formed on other exposed conductive surfaces of the assembly. If such plating is not desired, then the other exposed conductive surfaces can be masked or otherwise desensitized, or undesired plating can be selectively removed. The invention includes the possibility that the plating will produce not only the cross-conductor but also at least part of the laminar conductive members in the device.

The plating techniques which are used for making conductive vias through insulating circuit boards can be used in the present invention.

Another technique for providing the cross-conductors is to place a moldable or liquid conductive composition in preformed apertures, and if desired or necessary, to treat the composition, while it is in the apertures, so as to produce cross-conductors of desired properties. The composition can be supplied selectively to the apertures, e.g. by means of a screen, or to the whole assembly, if desired after pretreating at least some of the assembly so that the composition does not stick to it. For example, a molten conductive composition, e.g. solder, could be used in this way, if desired, using wave soldering techniques.

The cross-conductor can also be provided by a preformed member, e.g. a metal rod or tube such as a rivet. When such a preformed member is used, it can create the aperture as it is put in place in the device.

The cross-conductor can partially or completely fill the aperture. When the aperture is partially filled, it can be further filled (including completely filled) during the process in which the device is connected to other electrical components, particularly by a soldering process. This can be encouraged by providing additional solder in and around the aperture, especially by including a plating of solder in and around the aperture. Normally at least a part of the cross-conductor will be put in place before the device is connected to other electrical components. However, the invention includes the possibility that the cross-conductor is formed during such a connection process, as for example by the capillary action of solder during a soldering process.

Figure 15:
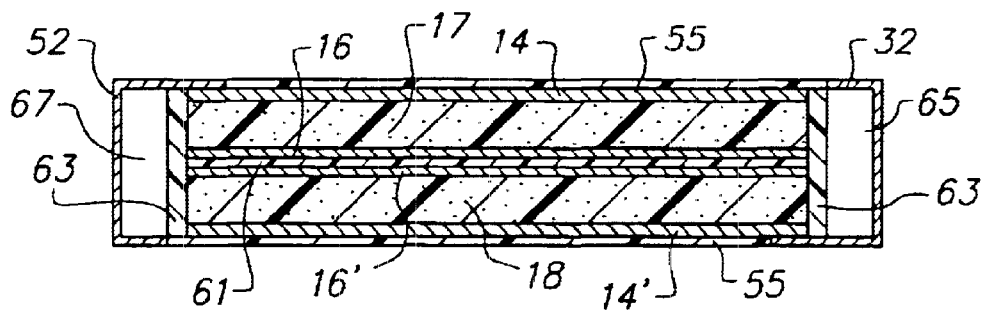
FIG. 15 is a cross-sectional view of a composite device with two elements connected in series.

A cross-conductor may be designed such that it electrically connects some of the layers, i.e. some of the laminates, together, but not all. Such cross-conductors are depicted in FIG. 15. A method for making such a cross-conductor would comprise forming an aperture which is larger than the desired size for the cross-conductor, filling the aperture with an insulating substance, forming an inner aperture within the insulating substance, and plating the inner aperture to render it conductive. This method insulates the internal electrodes from the cross-conductor, yet allows the external electrodes to be electrically connected.

Connectors Which are not Cross-Conductors

The electrical connection(s) between the electrode(s) and any residual member(s) on the various faces of the PTC resistive elements is preferably through a cross-conductor as described above. However, it can be of any kind, for example a connector which will remain in place even if it is not bonded to the other parts of the device, for example a U-shaped member which extends around the ends of a layer or combination of layers of the device.

Residual Laminar Conductive Members

Figure 12:
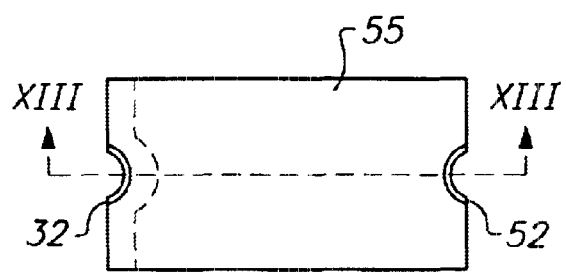
FIG. 12 is a plan view of another composite device with two elements connected in parallel but with no residual conductive members as illustrated in FIG. 13.
Figure 13:
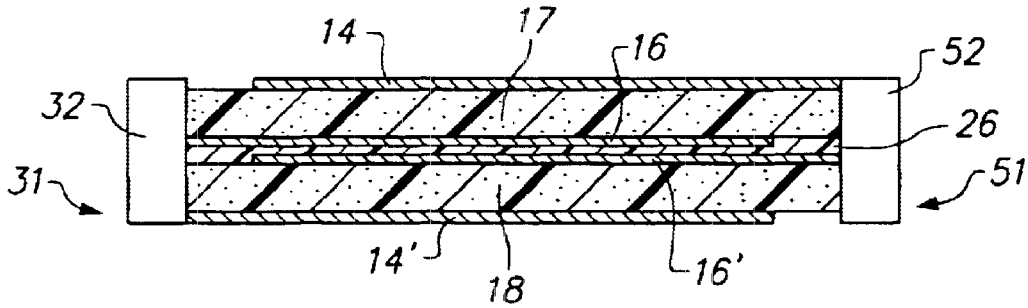
FIG. 13 is a cross-sectional view along line XIII—XIII in FIG. 12.

A preferred embodiment of a device of the invention comprises an additional (residual) conductive member which is secured to the same face of the PTC element as the second electrode, but is separated therefrom. This residual laminar conductive member which, with the cross conductor or other connector, can be present to provide an electrical path to other electrodes, is formed by removing part of a laminar conductive member, the remainder of the of the laminar conductive member then being an electrode. Residual laminar conductive members may be present on both internal and external faces of the laminar elements. The shape of the residual laminar conductive member, and the shape of the gap between the residual member and an electrode, can be varied to suit the desired characteristics of the device and for ease of manufacture. The residual conductive member is conveniently a small rectangle at one end of a rectangular device, separated from an electrode by a rectangular gap. Alternatively, the residual member can be an island separated from the electrode by a gap of closed cross-section. Devices can also be designed without a residual conductive member, as shown in FIGS. 12 and 13.

Additional Laminar Elements

The first and second laminar PTC resistive elements of the device or the first and second laminates of the assembly can be physically secured together in a stack, using a third laminar element between them. The third laminar element may comprise an electrically nonconductive adhesive, e.g. a hot-melt adhesive or a curable bonding material, to which fillers can be added to achieve particular thermal or mechanical properties. The third laminar element can also comprise curable monomeric organic or inorganic systems, such as epoxies, acrylates, allyls, urethanes, phenolics, esters, alkyds, etc. If it is desired that the laminar element act as an electrical insulator, then it is preferred that the resistivity is at least $10^6$ ohm-cm, particularly at least $10^9$ ohm-cm. For some embodiments it may be desired that the third laminar element comprise a conductive material. For these embodiments, the third laminar element serves to connect the layers together electrically as well as physically. A composite device configuration incorporating a conductive third laminar element is illustrated in FIG. 15. For other embodiments, it may be desired that the third element comprise a conductive material which is electrically conductive in only one direction (see FIG. 14). The third laminar element can also provide other functions, e.g. a thermally conductive layer to facilitate thermal transfer between the layers of the composite device.

Figure 21:
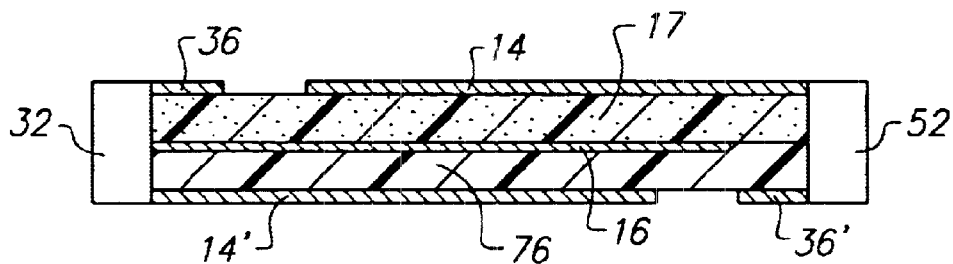
FIG. 21 is a cross-sectional view of a composite device with two external electrodes and one internal electrode.

Alternatively, devices can be designed which do not include a separate laminar layer to secure the elements of the device together. For example, a device can be made which is similar to that depicted in FIG. 8, with the laminar element 26 eliminated. The cross-conductors 32 and 52 can be relied upon to both electrically connect the layers together in parallel, and to physically secure the layers together. FIG. 21 depicts another example where the composite device does not require a separate laminar element between the layers.

Devices

Figure 5:
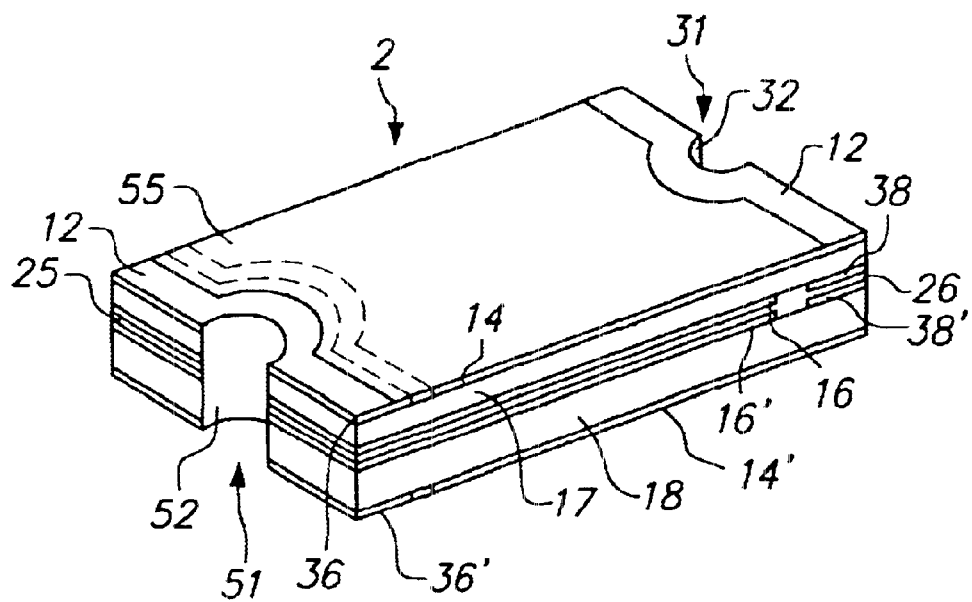
FIG. 5 is a perspective view of a composite device of the invention.

In a simple device, as shown in FIG. 5 there are two external electrodes, two internal electrodes, two cross-conductors or other connectors, and four residual conductive members. This configuration is useful since the device will then be symmetrical top to bottom, allowing for ease of installation by automated equipment or otherwise.

Particularly preferred circuit protection devices of the invention have a resistance at 23° C. of less than 1 ohm, preferably less than 0.5 ohm, particularly less than 0.3 ohm, especially less than 0.1 ohm, and comprise first and second laminar PTC resistive elements, each of which (a) is composed of a conductive polymer which has a resistivity at 23° C. of less than 50 ohm-cm, preferably less than 10 ohm-cm, particularly less than 5 ohm-cm, and which exhibits PTC behavior, and (b) has a first face and a second face. A first external metal foil electrode contacts the first face of the first PTC element and a second external metal foil electrode contacts the first face of the second PTC element. Third and fourth internal metal foil electrodes contact the second faces of the first and second PTC elements, respectively. The device preferably has a fifth and sixth residual external metal foil conductive members, the fifth contacting the first face of the first PTC element and spaced apart from the first external electrode, and the sixth contacting the first face of the second PTC element and spaced apart from the second external electrode. Generally there are seventh and eighth residual internal metal foil conductive members, the seventh contacting the second face of the first PTC element and spaced apart from the third internal electrode, and the eighth contacting the second face of the second PTC element and spaced apart from the fourth internal electrode. The device may also comprise one or more additional laminar polymer elements, which may be conductive or insulating. Preferably one of the additional elements is a third laminar polymer element which is insulating, lies between the first and the second PTC elements, and is secured to the exposed internal surfaces of the PTC elements which may comprise the internal faces of the PTC elements or their internal electrodes or internal conductive members. The PTC elements, the electrodes and the residual conductive members define two apertures, the first of which runs between the first external electrode, the seventh and eighth internal residual conductive members, and the second external electrode, and the second of which runs between the fifth residual external conductive member, the third and fourth internal electrodes and the sixth residual external conductive member, and through the first and second PTC elements and the third laminar polymer layer, if present. In addition, the device comprises first and second transverse conductive members which are composed of metal. The first transverse conductive member lies within the first aperture, and is physically and electrically connected to the first and second external electrodes and the seventh and eighth internal residual conductive members. The second transverse conductive member lies within the second aperture, and is physically and electrically connected to the fifth and sixth external residual conductive members and the third and fourth internal electrodes.

Other embodiments of the device may not contain residual (also called additional) conductive members.

The devices of the invention can be of any appropriate size. However, it is an important advantage for applications to make the devices as small as possible. Preferred devices have a maximum dimension of at most 12 mm, preferably at most 7 mm, and/or a surface area of at most 60 $mm^2$, preferably at most 40 $mm^2$, especially at most 30 $mm^2$, and it can be much smaller, e.g. at most 15 $mm^2$.

Processes

The methods disclosed herein make it possible to prepare devices very economically by carrying out all or most of the process steps on a large stack of laminates, and then dividing the laminate into a plurality of individual composite devices. The division of the stack can be carried out along lines which pass through any, some or all of the conductive surfaces, or through any, some or all of the cross conductors. These lines of division, also called isolation lines or delineation lines, can be of any shape suitable for producing devices of a particular configuration, e.g. straight, curved, or at angles. Similarly "functional" lines, e.g. the gaps between an electrode and a residual member, can be of any suitable shape. The process steps prior to the division can in general be carried out in any convenient sequence. For example, it is often convenient to pattern the internal conductive surfaces prior to assembling the stack, and to pattern the external conductive surfaces after assembly. However, it is possible to pattern both internal and external conductive surfaces prior to assembly. The patterning of a conductive surface can be the same or different as that on other conductive surfaces in the stack, depending on the desired functionality of the final device. For example, FIGS. 5, 6, 8, 9, 11 and 12 show devices which have internal electrodes which are the mirror images of external electrodes. FIGS. 10 and 18 to 20 show devices which have internal electrodes which are patterned differently than external electrodes. Often, it is useful to pattern conductive surfaces by removing, e.g. by etching, stamping, or milling, conductive material. Alternatively, the pattern can be produced by an additive process, e.g. screen printing, sputtering, or deposition. For some applications, it is useful to remove strips of conductive material in staggered strips alternately from opposite sides of a laminate layer to balance the physical stresses in the product. The resulting pattern will contain gaps or recesses suitable for separating a second electrode from a residual member in a device, separating one device from another, providing delineation for subdividing the assembly into individual devices, allowing for orientation of individual laminates or the assembled stack, or providing marking.

Cross-conductors, i.e. electrical connections, can be formed before or after the laminates are formed into the stack. If it is desired to form cross-conductors which do not traverse all layers of the stack, it may be convenient to form them for the desired laminate layers only, and then assemble the stack. Alternatively, using a blind via process, the connection can be made after the stack is assembled. Assembly of the stack can be accomplished in stages, for example, some laminates are prepared and secured together, some further processing steps are performed on the partially constructed stack (e.g. formation and plating of cross-conductors), and then other laminates can be secured to this partially constructed stack to complete the assembly. Subdivision of the stack into composite devices can be accomplished using a variety of techniques such as sawing, shearing, dicing, punching, and snapping, e.g. by using a saw, a shear, a blade, a wire, a waterjet, a snapping device, a laser, or a combination of these. Some preferred processes for making devices from a single laminate are disclosed in U.S. Pat. No. 5,864,281. These processes may be adapted for the subdivision of a stack of laminates such as that described herein. Alternatively, some of the steps in the process, e.g. securing the laminates in a stack and making a plurality of electrical connections by means of cross-conductors, can be accomplished simultaneously.

In order to minimize curling or warping due to shrinkage during subsequent processing steps, it may be preferred to apply a pattern around the perimeter of at least one laminate. The preferred pattern is produced by a process comprising selectively removing conductive material from at least one conductive surface of each laminate in an alternating cross-directional design, e.g. in the shape of a "W" or a "Z", around the perimeter of the laminate such that there is electrical continuity between the outer edge of the conductive surface for the external layers.

Part or all of the external conductive surface may be covered with an insulating layer, e.g. a solder mask or marking material such as that disclosed in U.S. Pat. No. 5,831,510.

The invention is illustrated in the accompanying drawings, in which features such as apertures and the thicknesses of components are not drawn to scale to make them more clear. FIG. 1 is a perspective view of a section of a stack 1 which has two laminar elements 7 and 8, each of which has patterned external conductive surfaces 3 and 3', respectively, and patterned internal conductive surfaces 5 and 5', respectively. The elements 7 and 8 are secured to each other with insulating laminar element 6. Tubular cross conductors 11 extend through the stack as shown.

Figure 2:
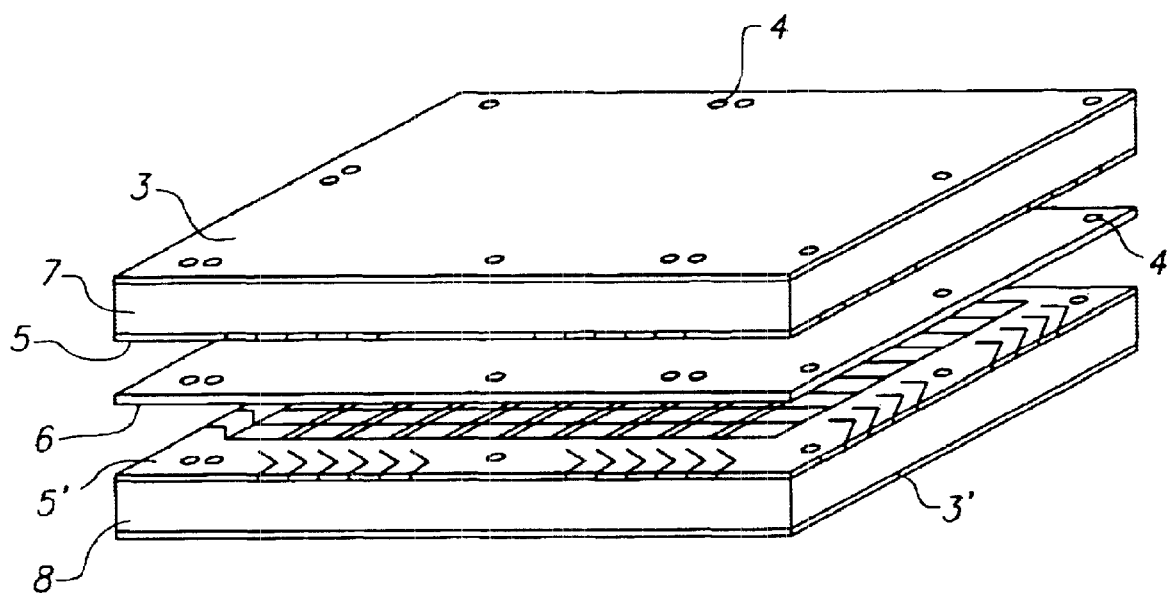
FIG. 2 is an exploded view of a stack which has been patterned on the internal conductive surfaces.

FIG. 2 is an exploded view of a stack under construction according to the process of the invention. Two laminar elements 7 and 8, each having patterned internal conductive surfaces 5 and 5', respectively, and unpatterned external conductive surfaces 3 and 3', respectively, are included in the stack, with a laminar element 6 sandwiched between 7 and 8. Registration holes 4 are used to orient the elements of the stack uniquely, align them relative to each other, and to position the stack for subsequent processes such as patterning of external surfaces and the formation of apertures.

Figure 3:
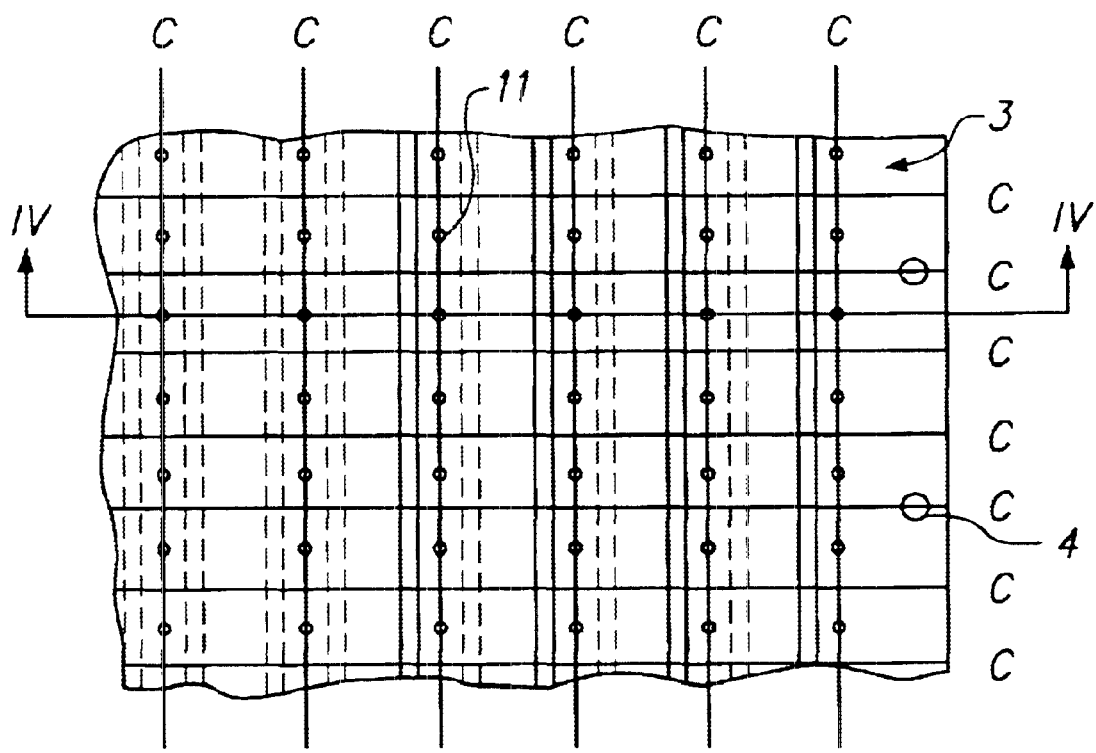
FIG. 3 is a plan view of the top of a section of a stack.
Figure 4:
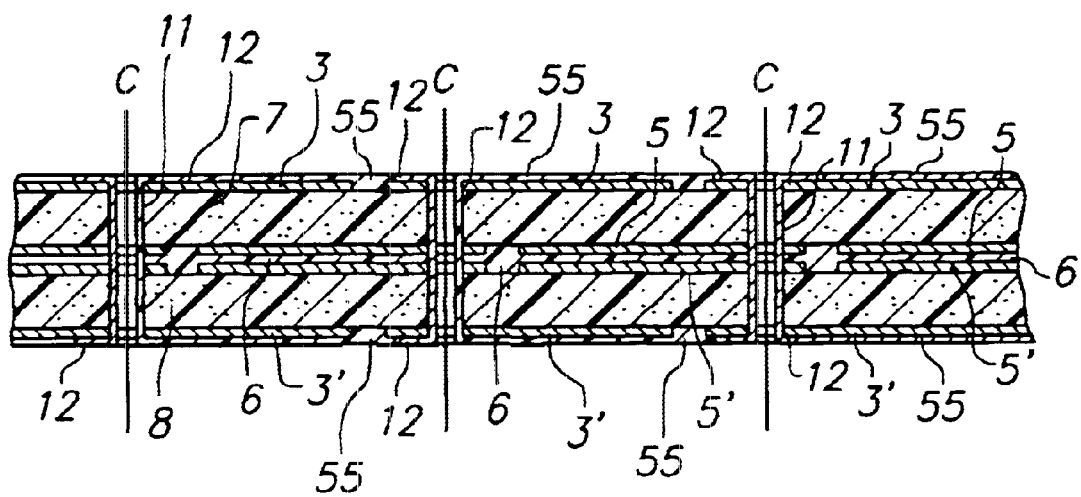
FIG. 4 is a cross-sectional view of a section of a stack along line IV—IV in FIG. 3.

FIG. 3 is a plan view of a patterned external conductive surface 3 of a section of a stack. C marks where the subdivision of the stack into composite devices will occur. FIG. 4 is a cross-sectional view along line IV—IV of FIG. 3. The stack includes laminar elements 7 and 8 each having internal conductive surfaces 5 and 5' and external conductive surfaces 3 and 3', and laminar element 6 which is sandwiched between 7 and 8. The stack has been plated to provide the tubular cross conductors 11 in each of the apertures (and a plating 12 on other exposed external surfaces of the stack). The stack as shown will be subdivided through the tubular cross conductors, forming cross conductors with semicircular cross-sections.

FIG. 5 is a perspective of a composite device 2 formed by subdividing a stack. Two laminar PTC elements 17 and 18, each having external electrodes 14 and 14', respectively, external residual conductive members 36 and 36', internal electrodes 16 and 16' and internal residual conductive members 38 and 38', are secured together with laminar element 26. A first transverse member 31 and a second transverse member 51 are hollow tubes formed by a plating process in which the exposed surfaces are plated with copper and then with solder to form a first plating 32 on transverse member 31, and a second plating 52 on transverse member 51. A dielectric coating 55 covers the external surfaces of the device except where it is desired to make electrical connection. A plating 12 is applied to the exposed portions of the external electrodes. The region between the dashed lines indicates portions under the dielectric coating 55 in which there is no electrode material.

Figure 6:
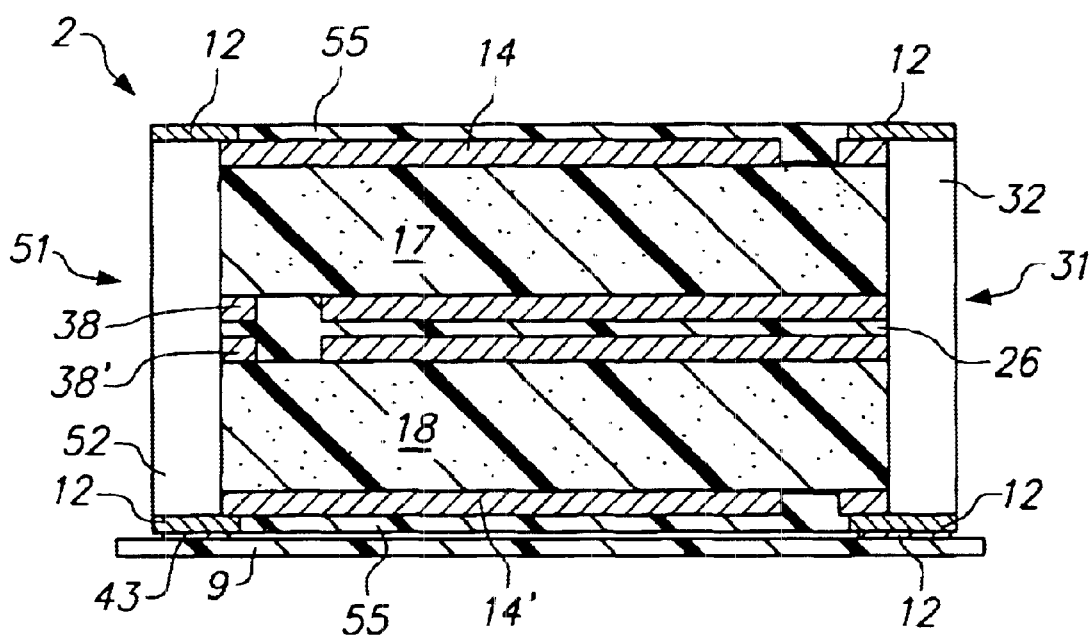
FIG. 6 is a cross-sectional view of a composite device mounted on a printed circuit board parallel to the board.

FIG. 6 shows in cross-section a composite device 2 as in FIG. 5 soldered to traces 41 and 43 on an in insulating substrate 9.

Figure 7:
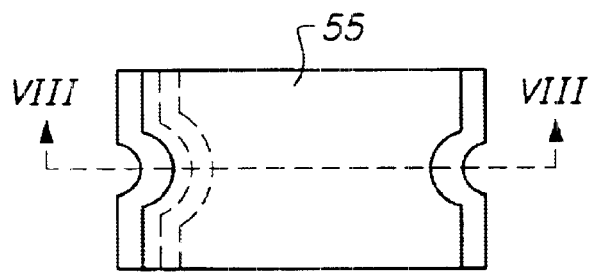
FIG. 7 is a plan view of composite devices further illustrated in FIGS. 8, 9, 10, 11, 14, and 21.
Figure 8:
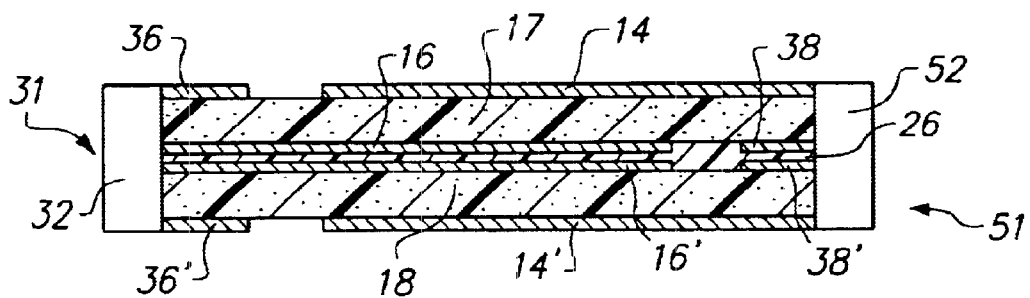
FIGS. 8, 9, and 10 cross-sectional views along line VIII—VIII in FIG. 7 of composite devices with two elements connected in parallel.
Figure 9:
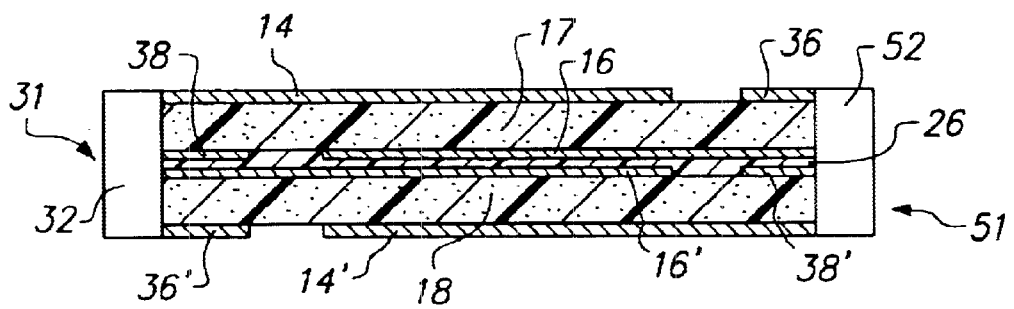
Figure 10:
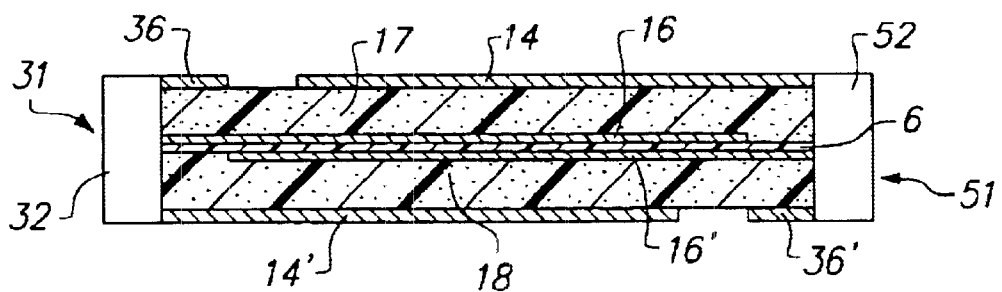
Figure 11:
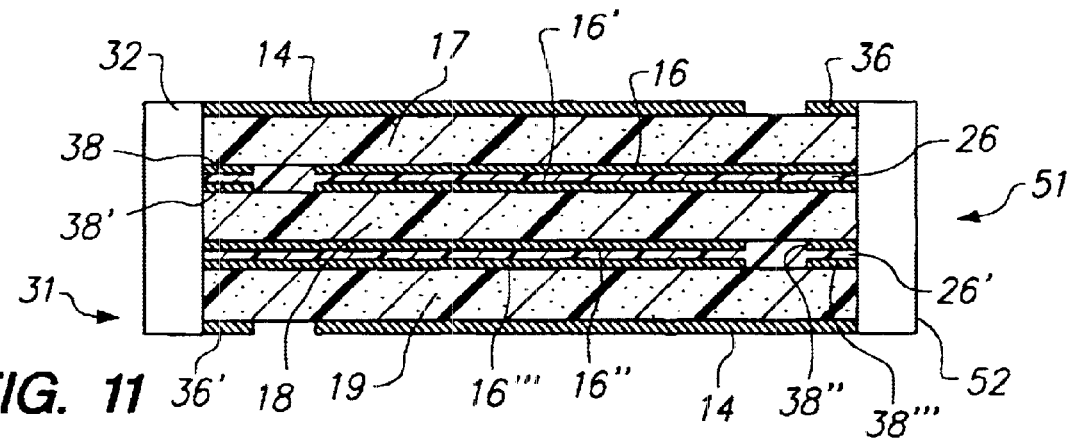
FIG. 11 is a cross-sectional view along line VIII—VIII in FIG. 7 of a composite device with three elements connected in parallel.

FIG. 7 is a plan view for a variety of composite devices shown in cross-section along line VIII—VIII in FIGS. 8 to 11, 14, and 21. The dashed lines indicate portions positioned underneath the dielectric layer 55, wherein the electrode material is not present. Note that for the cross-sectional views in FIGS. 8–11, 14 and 21, the dielectric layer 55 is not shown. FIGS. 8 and 9 show two configurations for PTC elements connected in parallel. For the device shown in FIG. 8 when it is in its switched, high resistance state, the laminar element 26 will have no potential drop across it when a potential is applied to one external electrode 14 and one external residual conductive member 36. However, for the device shown in FIG. 9, when in its switched state, the laminar element 26 will have a potential drop across it for the same external electrical connection. FIG. 10 shows a variant of the device shown in FIG. 8, with no internal residual conductive members. FIG. 11 shows a composite device formed by connecting three laminar elements 17, 18, and 19 in parallel, with laminar element 26 between 17 and 18, and laminar element 26' between 18 and 19. The version of the device shown has internal electrodes 16, 16', 16" and 16", and internal residual conductive members 38, 38', 38", and 38'''.

FIG. 12 is a plan view of a device with no residual conductive members; a cross-sectional view along XIII—XIII is shown in FIG. 13. Dashed lines indicate regions positioned under the external dielectric layer 55 where electrode material is not present. Dielectric layer 55 is not shown in FIG. 13.

Figure 14:
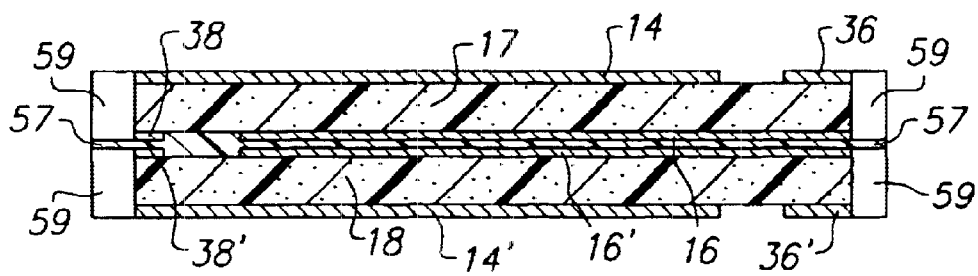
FIG. 14 is a cross-sectional view along line VIII—VIII of FIG. 7 of another composite device with two elements connected in parallel.

FIG. 14 is a composite device formed by the process of this invention, in which cross conductors do not extend completely through all layers of the stack. To make the device as shown here, cross conductors 59 extend only between external and internal conductive surfaces of each laminar element of the stack; the laminar elements are then secured together using a anisotropically conductive substance 57 which conducts only in the z-direction, where z-refers to the direction from bottom to top of the composite device. Conductive substance 57 provides electrical connection between internal residual conductive members 38 and 38' and between internal electrodes 16 and 16', without causing 38 or 38' to be shorted to 16 or 16'.

FIG. 15 shows a composite device in which laminar elements 17 and 18 are connected in series. The laminar elements are secured together in the stack using a conductive material 61. Cross-conductors are made in the stack which connect to some conductive surfaces, but not all. To form such a cross conductor, apertures larger than the desired dimensions of the cross conductor are formed through the stack. The apertures are then filled with an insulating substance 63, and two smaller apertures 65 and 67 are formed within the volumes filled with the insulator 63. The apertures 65 and 67 and exposed external electrodes have platings 32 and 52.

Figure 16:
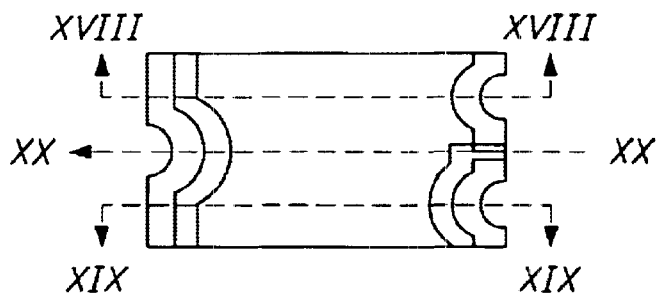
FIG. 16 is a plan view of a composite device with more than two external electrical connection points.
Figure 17:
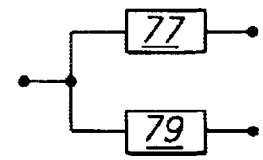
FIG. 17 is an electrical diagram of the interconnection scheme of the individual devices connected together to form the composite devices of FIGS. 16 and 18 to 20.

FIG. 16 shows a plan view of a composite device which includes two devices and has three external electrical connection points. A diagram of the electrical connections for the two devices 77 and 79 is shown in FIG. 17.

Figure 18:
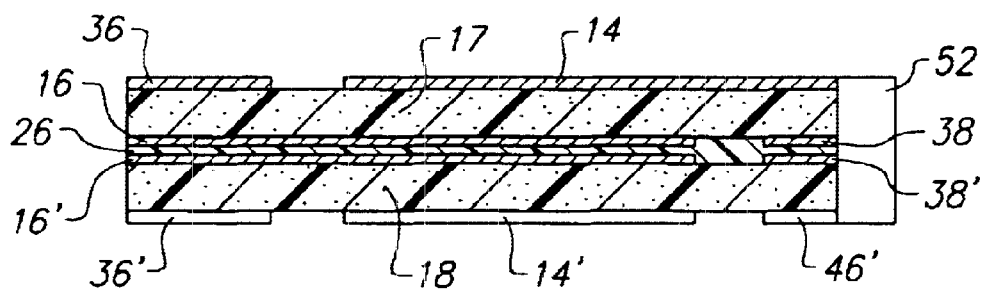
FIGS. 18, 19, and 20 are cross-sectional views along lines XVIII—XVIII, XIX—XIX, and XX—XX, respectively, in FIG. 16.

FIG. 18 shows a cross-section along line XVIII—XVIII in FIG. 16. Cross-conductor 52 is in electrical contact with the internal residual members 38 and 38'. A gap separates the residual members 38 and 38' from internal electrodes 16 and 16'. Additional conductive member 46' is also present.

Figure 19:
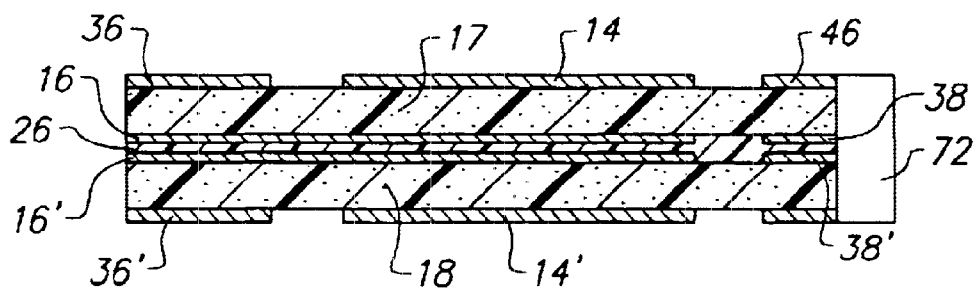

FIG. 19 shows a cross-section along line XIX—XIX in FIG. 16. Cross-conductor 72 is in electrical contact with internal residual conductive members 38 and 38'. A gap separates the residual members 38 and 38' from internal electrodes 16 and 16'. Additional conductive member 46 is also present.

Figure 20:
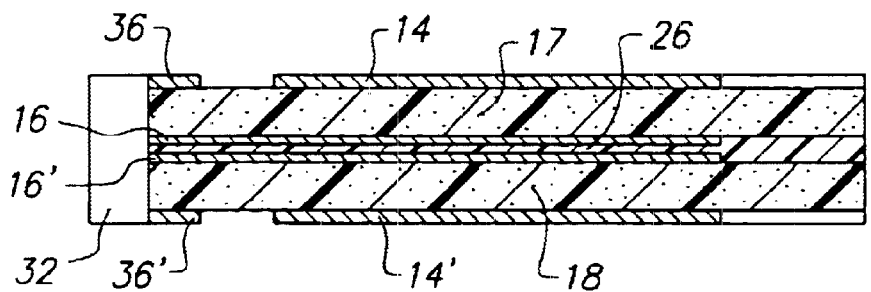

FIG. 20 shows the cross-sectional view along XX—XX in FIG. 16.

FIG. 21 illustrates a composite device which has only one internal electrode 16, formed from a stack with only one internal conductive surface. A laminar element 17 is combined with the laminar element 78. The laminar elements can be pressed together to form a bond, so that no third laminar element is required to secure the laminar elements together. For example, 17 can comprise a PTC element and 78 can comprise a dielectric substrate with adhesive properties.

Figure 22:
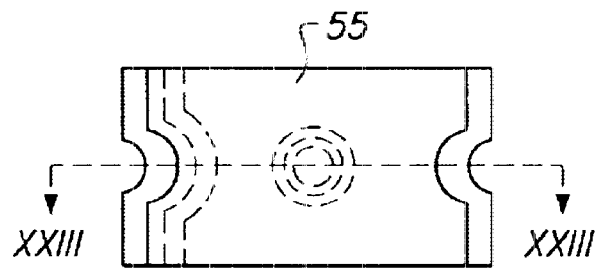
FIG. 22 is a plan view of a composite device with multiple electrical connections between layers of a composite device.

FIG. 22 is a plan view of a composite device which has multiple cross conductors to provide extra current carrying capacity, and extra robustness should one or both of the other cross conductors become damaged or form an open circuit. The dashed line indicates regions where there is no electrode material; the dotted circle indicates the region of an additional cross-conductor.

Figure 23:
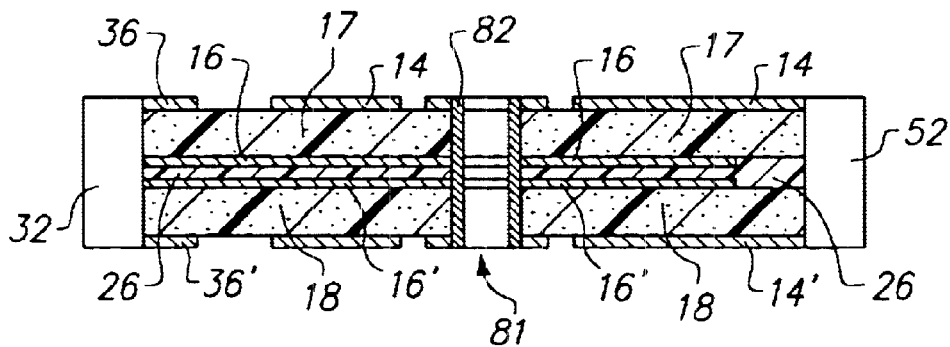
FIG. 23 is a cross-sectional view along line XXIII—XXIII in FIG. 22.

FIG. 23 is a cross-sectional view along XXIII—XXIII in FIG. 22 (dielectric layer 55 not shown). A third aperture 81 has a metal plating 82 and forms an additional electrical connection between the internal electrodes 16 and 16'. Note that there is a region around the external electrodes 14 and 14' where no electrode material is present.

The invention is illustrated by the following Example.

EXAMPLE

A stack in accordance with FIGS. 1 and 2 was prepared by the following method. Two laminates, each having a thickness of about 0.264 mm (0.0104 inch) were prepared by attaching a nickel/copper foil having a thickness of about 0.0356 mm (0.0014 inch) to both sides of a 0.193 mm (0.0076 inch)-thick sheet of conductive polymer. The conductive polymer was prepared by mixing about 40% by volume carbon black (Raven™ 430, available from Columbian Chemicals) with about 60% by volume high density polyethylene (Chevron™ 9659, available from Chevron), and then extruding into sheet and laminating in a continuous process. The laminated sheet was cut into individual laminates of 0.30 m×0.41 m (12 inch×16 inch). The laminates were irradiated to 4.5 Mrad using a 4.5 MeV electron beam.

Each of the laminates was drilled in an asymmetric pattern around its the periphery to provide holes and slots to register the laminates in a known x-y orientation in the plane of the laminate. These registration holes and slots were used to align plaques relative to each other in forming a stack, and for subsequent alignment of the tooling for imaging, solder masking, and plating operations. A 0.0762 mm (0.003 inch)-thick layer of modified acrylic adhesive (Pyralux™ LFO, available from DuPont) was also drilled with registration holes suitable for alignment.

One surface of one foil layer of each of two laminates were patterned using an etching technique in which they were first coated with an etch resist, then imaged in a desired pattern. The etch resist was developed and etching was accomplished using cupric chloride before the resist was stripped away. These same foil layers were patterned to define the periphery of the individual devices and the residual conductive members. In addition, the outer edges of the metal foil on the laminate were etched to provide an alternating cross directional pattern around the perimeter, as shown in FIG. 2. Paths providing electrical continuity were utilized during the subsequent electrolytic plating of Sn/Pb.

A stack was formed by positioning two laminates with their pattern-matched etched sides facing inward, and with an adhesive layer sandwiched in between, as shown in FIG. 2. A fixture was used to align the layered laminates, and the stack was heated while under pressure to permanently attach the layers into a laminated structure. The thickness of the stack formed was approximately 0.61 mm (0.024 inch).

Holes having a diameter of 0.94 mm (0.037 inch) were drilled through the entire stack to form apertures. The stack was treated with a plasma etch. The apertures were then coated with colloidal graphite, and the stack was electrolytically plated with copper.

The external metal foil layers of the stack were then patterned by etching. The registration holes were used to ensure the pattern which was etched was properly aligned with the internal layers which were etched previously. An alternating cross-directional pattern around the edges was etched as previously described.

A soldermask (Finedel DSR 2200 C-7, available from Tamura Kaken Co., Ltd.) was applied to one external metal foil layer of the stack, tack-cured, and then applied to the second external metal foil layer of the stack, and tack-cured. The soldermask was then imaged and developed. Marks were applied to identify individual parts, and the panel was then heated to fully cure the mask. A SnPb solder plate was deposited in the solder pad regions for use in attaching devices to circuit boards.

The assembly was divided to produce devices as shown in FIG. 5 by first separating the assembly into strips using a shear or saw, and then subdividing the strips into individual devices by mechanical snapping using a two-step process in which the strips were first bent to form a fracture in the conductive polymer at the isolation line, and then were sheared along that isolation line. The devices produced had dimensions of about 4.5 mm×3.4 mm×0.7 mm (0.179 inch× 0.133 inch×0.029 inch), and a resistance of about 0.031 ohm. Following installation onto a printed circuit board by solder reflow, the devices had a resistance of about 0.050 ohm.

What is claimed is:

1. A process for manufacturing a composite polymeric circuit protection device, said process comprising (1) providing a polymeric assembly comprising
  (a) providing first and second laminates, each of which comprises a laminar polymer element having at least one conducive surface;
  (b) providing a pattern of conducive material on at least one of the conductive surfaces, and one of which comprises a PTC conductive polymer composition on one laminate;
  (c) securing the laminates in a stack in a desired configuration, at least one conductive surface of at least one of the laminates comprising an eternal conductive surface of the stack; and
  (d) making a plurality of electrical connections between a conductive surface of the first laminate and a conductive surface of the second laminate, steps (c) and (d) being performed simultaneously; and
(2) subdividing the assembly into individual devices each of which comprises at least one electrical connection.

2. A process according to claim 1, wherein the pattern in step (b) is formed by selectively removing a portion of conductive material from at least one of the conductive surfaces on one laminate.

3. A process according to claim 2, wherein the selective removal of conductive material is accomplished by etching, milling, or stamping.

4. A process according to claim 1, wherein the pattern in step (b) is positioned on one of the external conductive surfaces.

5. A process according to claim 4, wherein the pattern on the external conductive surface is formed by selectively removing a portion of conductive material from the external conductive surface.

6. A process according to claim 4, wherein at least one of the patterned external conductive surfaces is at least partially covered with an insulating layer.

7. A process according to claim 1, wherein an additional conducive layer is added to at least part of at least one of the external conductive surfaces.

8. A process according to claim 1, wherein at least one laminate comprises markings which provide a unique identification of orientation.

9. A process according to claim 8, wherein the markings also provide delineation for subdividing into individual devices.

10. A process according to claim 1, wherein the assembly comprises a third laminate.

11. A process according to claim 1, wherein the laminates are secured to each other in the stack by an adhesive.

12. A process according to claim 1, wherein electrical connection is made between conductive surfaces of the first and second laminates in the stack by (i) forming an aperture which extends through the stack, and (ii) forming a conductive member within the aperture.

13. A process according to claim 1, wherein the electrical connections are positioned so that each of the individual devices comprises at least two electrical connections.

14. A process according to claim 1, wherein the laminar polymer element in each laminate comprises the same PTC conductive polymer composition.

15. A process according to claim 1, wherein the laminar polymer element in each laminate comprises a different PTC conductive polymer composition.

16. A process according to claim 1 wherein the assembly comprises three laminates, each of which comprises a PTC conductive polymer composition.

17. A process according to claim 1, wherein at least one of the laminar polymeric elements comprises a ZTC conductive polymeric material or an NTC conductive polymeric material.

18. A process according to claim 1, wherein at least one of the laminar polymeric elements comprises an insulating polymeric material.

19. A process according to claim 1, wherein the individual devices are subdivided from the assembly using a saw, a shear, a blade, a wire, a waterjet, a snapping device, a laser, or a combination of these.

20. A process according to claim 1 wherein the conductive surface on each laminate comprises a metal foil.

21. A process according to claim 1, which comprises providing a pattern on one of the external conductive surfaces and a pattern on an internal conductive surface.

22. A process according to claim 21, wherein the patterns on the internal and external conductive surfaces are different.

23. A process for manufacturing a composite polymeric circuit protection device, said process comprising
  (1) providing a polymeric assembly comprising
    (a) providing first and second laminates, each of which comprises a laminar polymer element having at least one conductive surface,
    (b) providing a pattern of conductive material on at least one of the conductive surfaces, and one of which comprises a PTC conductive polymer composition on one laminate;
    (c) securing the laminates to each other in a stack in a desired configuration by an adhesive, at least one conductive surface of at least one of the laminates comprising an external conductive surface of the stack, and
    (d) making a plurality of electrical connections between a conductive surface of the first laminate and a conductive surface of the second laminate; and
  (2) subdividing the assembly into individual devices each of which comprises at least one electrical connection.

24. A process according to claim 23, wherein the pattern in step (b) is formed by selectively removing a portion of conductive material from at least one of the conductive surfaces on one laminate.

25. A process according to claim 24, wherein the selective removal of conductive material is accomplished by etching, milling, or stamping.

26. A process according to claim 23, wherein the pattern in step (b) is positioned on one of the external conductive surfaces.

27. A process according to claim 26, wherein the pattern on the external conductive surface is formed by selectively removing a portion of conductive material from the external conductive surface.

28. A process according to claim 26, wherein at least one of the pat ed external conductive surfaces is at least partially covered with an insulating layer.

29. A process according to claim 23, wherein an additional conductive layer is added to at least part of at least one of the external conductive surfaces.

30. A process according to claim 23, wherein at least one laminate comprises markings which provide a unique identification of orientation.

31. A process according to claim 30, wherein the markings also provide delineation for subdividing into individual devices.

32. A process according to claim 23, wherein the assembly comprises a third laminate.

33. A process according to claim 23, wherein electrical connection is made between conductive surfaces of the first and second laminate in the stack by (i) forming an aperture which extends through the stack, and (ii) forming a conductive member within the aperture.

34. A process according to claim 23, when the electrical connections are positioned so that each of the individual devices comprises at least two electrical compositions.

35. A process according to claim 23, wherein the laminar polymer element in each laminate comprises the same PTC conductive polymer composition.

36. A process according to claim 23, wherein the laminar polymer element in each laminate comprises a different PTC conductive polymer composition.

37. A process according to claim 23 wherein the assembly comprises three laminates, each of which comprises a PTC conductive polymer composition.

38. A process according to claim 23, wherein at least one of the laminar polymeric elements comprises a ZTC conductive polymeric material or an NTC conductive polymeric material.

39. A process according to claim 23, wherein at least one of the laminar polymeric elements comprises an insulating polymeric material.

40. A process according to claim 23, wherein the individual devices are subdivided from the assembly using a saw, a shear, a blade, a wire, a waterjet, a snapping device, a laser, or a combination of these.

41. A process according to claim 23 wherein the conductive surface on each laminate comprises a metal foil.

42. A process according to claim 23, which comprises providing a pattern on one of the external conductive surfaces and a pattern on an internal conductive surface.

43. A process according to claim 42, wherein the patterns on the internal and external conductive surfaces are different.

* * * * *